(12) United States Patent
Lee et al.

(10) Patent No.: US 9,331,126 B2
(45) Date of Patent: May 3, 2016

(54) METHOD FOR FABRICATING FLEXIBLE DISPLAY USING A SHAPE MEMORY ALLOY FILM

(71) Applicant: Electronics and Telecommunications Research Institute, Daejeon (KR)

(72) Inventors: Sang Seok Lee, Sejong (KR); Kyoung Ik Cho, Daejeon (KR); Bock Soon Na, Daejeon (KR); Sang Chul Lim, Daejeon (KR); Chan Woo Park, Daejeon (KR); Soon-Won Jung, Daejeon (KR); Jae Bon Koo, Daejeon (KR); Hye Yong Chu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 196 days.

(21) Appl. No.: 14/280,578

(22) Filed: May 17, 2014

(65) Prior Publication Data

US 2015/0171354 A1    Jun. 18, 2015

(30) Foreign Application Priority Data

Dec. 12, 2013  (KR) .................. 10-2013-0154746

(51) Int. Cl.
*H01L 21/00* (2006.01)
*H01L 27/32* (2006.01)
*H01L 51/56* (2006.01)
*H01L 51/00* (2006.01)

(52) U.S. Cl.
CPC .......... *H01L 27/3244* (2013.01); *H01L 51/003* (2013.01); *H01L 51/0097* (2013.01); *H01L 51/56* (2013.01); *H01L 51/0094* (2013.01)

(58) Field of Classification Search
CPC ... H01L 51/003; H01L 51/0097; H01L 51/56; H01L 27/3244
USPC .......................................................... 438/28
See application file for complete search history.

(56) References Cited

U.S. PATENT DOCUMENTS

| 2009/0038749 A1 | 2/2009 | Kim et al. |
| 2013/0141345 A1* | 6/2013 | Wang .................. H04M 1/0266 345/173 |

FOREIGN PATENT DOCUMENTS

KR    10-1037794 A    5/2011

* cited by examiner

*Primary Examiner* — Matthew Gordon

(57) ABSTRACT

Provided is a method for fabricating a flexible display device. The method includes attaching a shape memory alloy film memorizing a shape thereof as a curved shape at a shape memory temperature or lower to a flexible substrate at a temperature higher than the shape memory temperature, forming a display device on the flexible substrate, and returning the shape memory alloy to the curved shape to remove the shape memory alloy film from the flexible substrate.

19 Claims, 4 Drawing Sheets

METHOD FOR FABRICATING FLEXIBLE DISPLAY USING A SHAPE MEMORY ALLOY FILM

CROSS-REFERENCE TO RELATED APPLICATIONS

This U.S. non-provisional patent application claims priority under 35 U.S.C. §119 of Korean Patent Application No. 10-2013-0154746 filed on Dec. 12, 2013, the entire contents of which are hereby incorporated by reference.

BACKGROUND OF THE INVENTION

The present invention disclosed herein relates to a method for fabricating a flexible display, and more particularly, to a method for fabricating a flexible display by using a shape memory alloy.

For easiness of processes, a flexible display is fabricated by using a method in which processes are performed on a rigid carrier, such as a glass or silicon carrier, and then the carrier is removed. In order to remove the carrier, since a complicated process which includes forming a sacrificial layer and applying of a solvent or irradiating of infrared rays, the removing of the carrier influences the flexibility of the plastic substrate. In another method, an etching stop layer is formed on a glass carrier and then the glass carrier is removed by using an enchant, such as a hydrofluoric acid or the like. However, this method has also limitations, such as process complexity, high costs, etc.

SUMMARY OF THE INVENTION

The present invention provides a method for fabricating a flexible display that removes a carrier by using the restoring force of a shape memory alloy.

Embodiments of the present invention provide methods for fabricating a flexible display including attaching a shape memory alloy film memorizing a curved shape at a shape memory temperature to a flexible substrate at a temperature higher than the shape memory temperature, forming a display device on the flexible substrate, and returning the shape memory alloy film to the curved shape to remove the shape memory alloy film from the flexible substrate.

In some embodiments, the shape memory alloy film may include a Ti—Ni alloy, a Ti—Ni—Fe alloy, a Cu—Al—Ni alloy, an Ag—Cd alloy, and any combinations thereof.

In other embodiments, the shape memory temperature may have a range from about −50° C. to about 0° C.

In still other embodiments, the attaching of the shape memory alloy film to the flexible memory may include fixing the shape memory alloy film aligned on the flexible substrate to the flexible substrate by pressing the shape memory alloy film with a roller.

In even other embodiments, the forming of the display device may include forming a thin film transistor array and a pixel array electrically connected to the thin film transistor array on the flexible substrate supported by the shape memory alloy film.

In yet other embodiments, the thin film transistor array may include a gate electrode, a gate insulting film, a source/drain electrode, and an oxide semiconductor thin film, and the pixel array may include a pixel electrode, an organic light emitting diode film, and an upper electrode.

In further other embodiments, the thin film transistor may be a bottom gate thin film transistor, which includes a gate buried in a gate insulating film disposed on the flexible substrate, an oxide semiconductor film embedded in the gate insulating film and disposed on the gate, and a source/drain electrode disposed on the gate insulting film.

In still further embodiments, the removing of the shape memory film may include cooling the shape memory alloy film to the shape memory temperature.

In even further embodiments, the above method may further include forming an encapsulation member on the display device after forming the display device on the flexible substrate.

In yet further embodiments, the encapsulation member may include a glass substrate or a metal cap.

In much further embodiments, the forming of the encapsulation member may include applying a sealant to an edge portion of the flexible substrate and curing the sealant to attach the flexible substrate and the encapsulation member to each other.

In still much further embodiments, the flexible substrate may be a plastic substrate.

In other embodiments of the present invention, methods for fabricating a flexible display include memorizing a curved shape in a shape memory alloy at a shape memory temperature, flattening the shape memory alloy film at a temperature higher than the shape memory temperature, attaching the shape memory alloy film to a plastic substrate, and returning the shape memory alloy film to the memorized curved shape by cooling the shape memory alloy film to a temperature not higher than the shape memory temperature to remove the shape memory alloy film from the plastic substrate.

In some embodiments, the above method may further include forming a polymer film in the plastic substrate such that upper portions of the polymer film are exposed spaced a predetermined distance before or after attaching the shape memory alloy film to the plastic substrate.

In other embodiments, the memorizing of the curved in the shape memory alloy film may include fixing the shape memory alloy film in the curved shape in a space between an inner cylinder with a small diameter and an outer cylinder with a large diameter surrounding the inner cylinder; and memorizing the curved shape in the shape memory alloy film by maintaining the shape memory alloy film fixed in the curved shape at the space between the inner cylinder and the outer cylinder at the shape memory temperature.

In still other embodiments, the forming of the display element on the plastic substrate may include forming a thin film transistor array on the plastic substrate, and forming a pixel array electrically connected to the thin film transistor array on the plastic substrate.

In even other embodiments, the plastic substrate may include an organic film.

In yet other embodiments, the organic film may include a polydimethylsiloxane.

In further other embodiments, the polymer film may include a polyimide.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
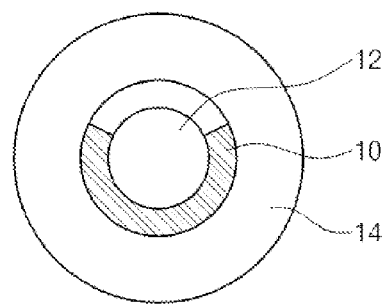
FIGS. 1 to 6 are cross-sectional views showing a method for fabricating a flexible display device according to an embodiment of the present invention.

Such benefits and advantages of the present invention will be apparent through detailed description described with reference to the accompanying drawings, and claims. Particularly, the present invention is well specified and apparently claimed in claims. However, the present invention will be more fully understood by referring to the following detailed description in conjunction with the accompanying drawings. In figures, like reference numerals refer to like elements.

Hereinafter, methods for fabricating a flexible display according to embodiments of the present invention will be described with reference to the accompanying drawings.

FIGS. 1 to 6 are cross-sectional views showing a method for fabricating a flexible display according to an embodiment of the present invention.

Referring to FIG. 1, a shape memory alloy film 10 may be prepared. A shape memory temperature of the shape memory alloy film 10 may have a range from about −50° C. to about 0° C. The shape memory alloy film 10 may include a Ti—Ni alloy (for example, Ti-51Ni), a Ti—Ni—Fe alloy (for example, Ti-47Ni-3Fe), a Cu—Al—Ni alloy (for example, Cu-14.5Al-4.4Ni), an Ag—Cd alloy (for example, Ag-45Cd), and any combination thereof. To memorize a curved shape, the shape memory alloy film 10 may be fixed in the curved shape between two cylinders 12 and 14 having different diameters. For example, the shape memory alloy film 10 is disposed at a space between the inner cylinder 12 with a small diameter and an outer cylinder 14 with a large diameter surrounding the inner cylinder 12, and may be maintained at a shape memory temperature for a predetermined time. Therefore, the curved shape may be memorized in the shape memory alloy film 10.

Figure 2:

Referring to FIG. 2, the shape memory alloy film 10 may be flattened at a temperature (for example, room temperature of from about 20° C. to about 25° C.) higher than the shape memory temperature. The shape memory alloy film 10 may be used as a carrier in a fabrication process of a flexible display.

Figure 3:
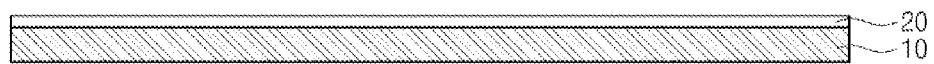

Referring to FIG. 3, the shape memory alloy film 10 may be attached to a plastic substrate 20, for example, by using glue (not shown). The plastic substrate 20 may have the same or a similar shape or size as the shape memory alloy film 10.

Figure 4:
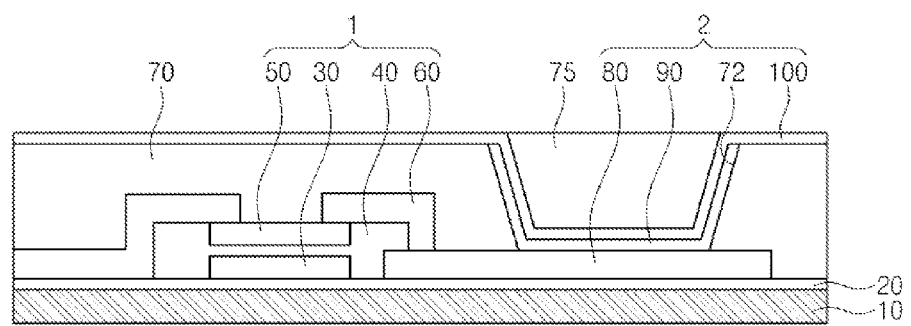

Referring to FIG. 4, a thin film transistor (TFT) array 1 and a pixel array 2 electrically connected to the TFT array 1 may be formed on the plastic substrate 20. The TFT array 1 may include a gate electrode 30, a gate insulating film 40 covering the gate electrode 30, an oxide semiconductor film 50 provided on the gate insulating film 40 on the gate electrode 30, and source/drain electrodes 60 disposed on the gate insulating film 40 and facing each other at both sides of the oxide semiconductor film 50. A protective film 70 may be formed on the plastic substrate 20 including the source/drain electrodes 60. While FIG. 4 shows a bottom gate thin film transistor structure, the TFT array 1 is not limited to this structure and may have a variety of structures.

The pixel array 2 may include a pixel electrode 80 electrically connected to the source/drain electrodes 60, an organic light emitting diode (OLED) film 90 formed in the protective film 70 and disposed in an opening 72 exposing the pixel electrode 80, and an upper electrode 100 disposed on the OLED film 90 and the protective film 70. An insulating film 75 filling the opening 72 in which the upper electrode 100 is formed may be formed.

Figure 5:
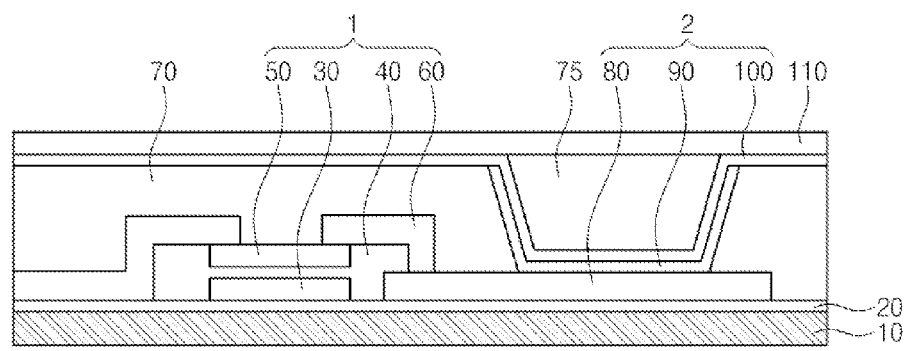

Referring FIG. 5, an encapsulation member 110 may be formed on the plastic substrate 20. The encapsulation member 110 is disposed on the upper electrode 100 and the insulting film 75 to encapsulate a display device including the TFT array 1 and the pixel array 2. To encapsulate the encapsulation member 110, a sealant may be applied along an edge portion of the plastic substrate 20. After the sealant is applied, the sealant may be cured by using UV (ultra violet) curing or thermal curing to bond the plastic substrate 20 and the encapsulation member 110.

The encapsulation member 110 may be formed to a glass substrate or metal cap. The encapsulation member 110 can prevent moisture or oxygen from permeating into the TFT array 1 and the pixel array 2.

Figure 6:
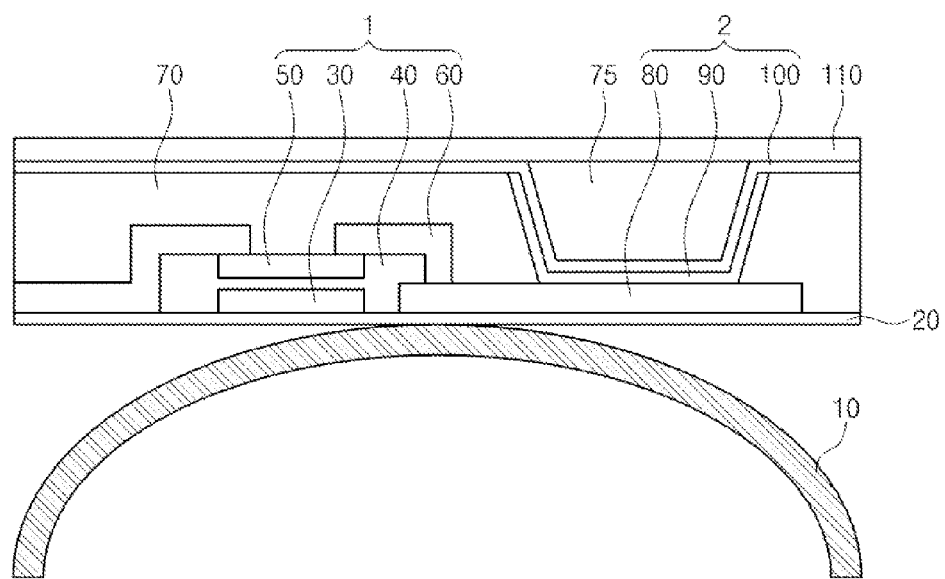

Referring FIG. 6, the shape memory alloy film 10 may be separated from the plastic substrate 20. By cooling the shape memory alloy film 10 to a shape memory recovery temperature (for example, a temperature of from about −50° C. to about 0° C.) to change the shape of the plastic substrate 20 to the curved shape, the shape memory alloy film 10 may be separated from the plastic substrate 20. According to this embodiment, the shape memory alloy film 10 may be separated from the plastic substrate 20 only by cooling. Therefore, the method in accordance with this embodiment does not needs a sacrificial film, such as an etching stop layer for separating the carrier, and does not affect the characteristics of the plastic substrate 20.

Figure 7:
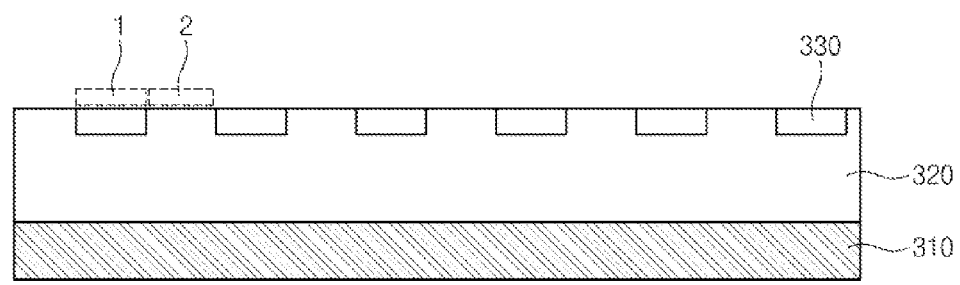
FIGS. 7 and 8 are cross-sectional views showing a method for fabricating a flexible display device according to another embodiment of the present invention.
Figure 8:
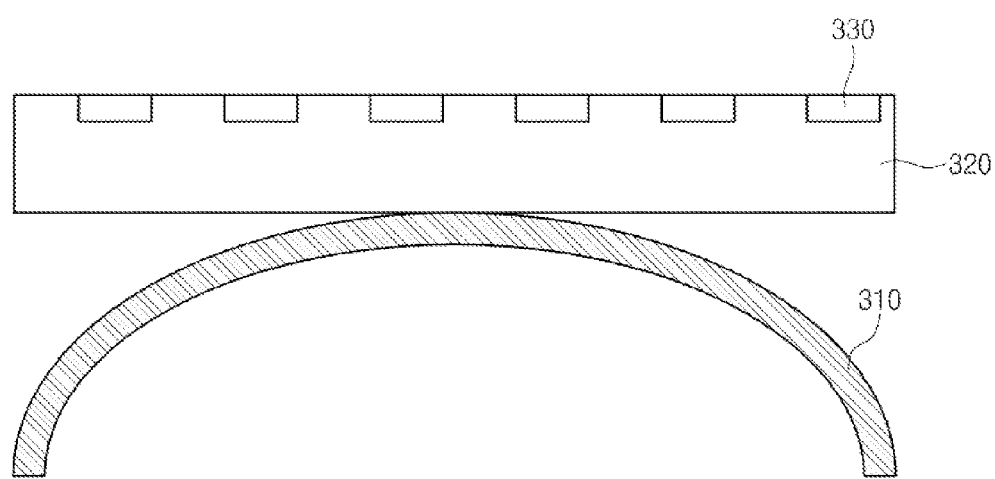

FIGS. 7 and 8 are cross-sectional views showing a method for fabricating a flexible display according to another embodiment of the present invention. The method according to the another embodiment is the same as or similar to the method according to the previous embodiment. Therefore, description of the another embodiment will be made centered on differences from the previous embodiment.

Referring to FIG. 7, a shape memory alloy film 310 memorizing a curved shape may be attached to a plastic substrate 320. The plastic substrate 320 may include an organic film and a plurality of polymer films 330 aligned spaced a predetermined distance in the organic film. Upper portions of the polymer films 330 may be exposed. The polymer films 330 may be formed before or after the shape memory alloy film 310 is attached to the plastic substrate 320. The plastic substrate 320 may include, for example, a polydimethylsiloxane (PDMS), and the polymer films 330 may include, for example, a polyimide. A TFT array 1 having the same or similar structure to that shown in FIG. 4 may be formed on the polymer films 330. A pixel array 2 having the same or similar structure to that shown in FIG. 4 may be formed on the plastic substrate 320. By disposing the rigid polymer films 330 on the plastic substrate 320 formed of a flexible organic film, a stretchable display device may be implemented in a curved shape.

Referring to FIG. 8, the shape memory alloy film 310 may be separated from the plastic substrate 320. By cooling the shape memory alloy film 310 to a shape memory recovery temperature to change the shape of the plastic substrate 320 to a curved shape, the shape memory alloy film 310 may be separated from the plastic substrate 320. Since the shape memory alloy film 310 may be separated from the plastic substrate 320 only by cooling, the method in accordance with this embodiment does not need a sacrificial film for removing the carrier and does not affect the characteristics of the plastic substrate 320.

In the method for fabricating a flexible display device according to the embodiment, the method has low cost and good flexible characteristic because that has simple process by using a shape memory alloy film and does not affect the flexibility of the plastic substrate. Also, since the shape memory alloy film is used as carrier can be used repeatedly, the flexible display device may be realized inexpensively.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for fabricating a flexible display, the method comprising:
    attaching a shape memory alloy film memorizing a shape thereof as a curved shape at a shape memory temperature or lower to a flexible substrate at a temperature higher than the shape memory temperature, wherein the shape memory alloy film serves as a carrier substrate;
    forming a display device on the flexible substrate; and
    returning the shape memory alloy film to the curved shape to remove the shape memory alloy film from the flexible substrate.

2. The method of claim 1, wherein the shape memory alloy film comprises a Ti—Ni alloy, a Ti—Ni—Fe alloy, a Cu—Al—Ni alloy, an Ag—Cd alloy, and any combinations thereof.

3. The method of claim 1, wherein the shape memory temperature has a range from about −50° C. to about 0° C.

4. The method of claim 1, wherein the attaching of the shape memory alloy film to the flexible memory comprises fixing the shape memory alloy film aligned on the flexible substrate to the flexible substrate by pressing the shape memory alloy film with a roller.

5. The method of claim 1, wherein the forming of the display device comprises forming a thin film transistor array and a pixel array electrically connected to the thin film transistor array on the flexible substrate supported by the shape memory alloy film.

6. The method of claim 5, wherein the thin film transistor array comprises a gate electrode, a gate insulating film, a source/drain electrode, and an oxide semiconductor thin film, and
    the pixel array comprises a pixel electrode, an organic light emitting diode film, and an upper electrode.

7. The method of claim 5, wherein the thin film transistor is a bottom gate thin film transistor, which comprises a gate buried in a gate insulating film disposed on the flexible substrate, an oxide semiconductor film buried in the gate insulating film and disposed on the gate, and a source/drain electrode disposed on the gate insulating film.

8. The method of claim 1, wherein the removing of the shape memory film comprises cooling the shape memory alloy film to the shape memory temperature.

9. The method of claim 1, further comprising forming an encapsulation member on the display device after forming the display device on the flexible substrate.

10. The method of claim 9, wherein the encapsulation member comprises a glass substrate or a metal cap.

11. The method of claim 9, wherein the forming of the encapsulation member comprises:
    applying a sealant to an edge portion of the flexible substrate, and
    curing the sealant to attach the flexible substrate and the encapsulation member to each other.

12. The method of claim 1, wherein the flexible substrate is a plastic substrate.

13. A method for fabricating a flexible display, the method comprising:
    memorizing a curved shape in a shape memory alloy film at a shape memory temperature or lower;
    flattening the shape memory alloy film at a temperature higher than the shape memory temperature;
    attaching the shape memory alloy film to a plastic substrate, wherein the shape memory alloy film serves as a carrier substrate for the plastic substrate; and
    returning the shape memory alloy film to the memorized curved shape by cooling the shape memory alloy film to a temperature not higher than the shape memory temperature to remove the shape memory alloy film from the plastic substrate.

14. The method of claim 13, further comprising forming a polymer film in the plastic substrate such that upper portions of the polymer film are exposed spaced a predetermined distance.

15. The method of claim 13, wherein the memorizing of the curved shape in the shape memory alloy film comprises:
    fixing the shape memory alloy film in the curved shape in a space between an inner cylinder with a small diameter and an outer cylinder with a large diameter surrounding the inner cylinder; and
    memorizing the curved shape by maintaining the shape memory alloy film fixed in the curved shape in the space between the inner cylinder and the outer cylinder at the shape memory temperature or lower.

16. The method of claim 13, wherein the forming of the display device on the plastic substrate comprises:
    forming a thin film transistor array on the plastic substrate, and
    forming a pixel array electrically connected to the thin film transistor array on the plastic substrate.

17. The method of claim 13, wherein the plastic substrate comprises an organic film.

18. The method of claim 17, wherein the organic film comprises a polydimethylsiloxane.

19. The method of claim 13, wherein the polymer film comprises a polyimide.

* * * * *